United States Patent [19]
Yamamoto et al.

[11] Patent Number: 5,791,045
[45] Date of Patent: Aug. 11, 1998

[54] PROCESS FOR THE PRODUCTION OF A DIAMOND HEAT SINK

[75] Inventors: Yoshiyuki Yamamoto; Takashi Tsuno; Takahiro Imai; Naoji Fujimori, all of Itami, Japan

[73] Assignee: Sumitomo Electric Industries, Ltd., Osaka, Japan

[21] Appl. No.: 819,440

[22] Filed: Mar. 17, 1997

Related U.S. Application Data

[62] Division of Ser. No. 257,288, Jun. 9, 1994, Pat. No. 5,642,779.

[30] Foreign Application Priority Data

Jun. 14, 1993 [JP] Japan ................... 5-141691
Jun. 30, 1993 [JP] Japan ................... 5-162093

[51] Int. Cl.$^6$ ........................................ B23P 15/26
[52] U.S. Cl. ........................................ 29/890.03
[58] Field of Search ................... 29/840.03, 505; 165/185

[56] References Cited

U.S. PATENT DOCUMENTS

| | | | |
|---|---|---|---|
| 3,721,289 | 3/1973 | Seal | 165/80 |
| 3,828,848 | 8/1974 | Custers et al. | 165/80 |
| 4,748,538 | 5/1988 | Tsuji | 361/386 |
| 4,770,242 | 9/1988 | Daikoku et al. | 165/185 |
| 4,964,458 | 10/1990 | Flint et al. | |
| 5,008,737 | 4/1991 | Burnham et al. | 165/905 |
| 5,038,858 | 8/1991 | Jordan et al. | 165/185 |

*Primary Examiner*—Irene Cuda
*Attorney, Agent, or Firm*—Wenderoth, Lind & Ponack, L.L.P.

[57] ABSTRACT

A diamond heat sink having a very high thermal property, to be used for radiation of semiconductor devices or compressors, includes a plate-shaped diamond substrate and fins for increasing the thermal property. The fins are combined with the substrate and are of a material having a heat conductivity of at least 1 (W/cm·K), for example, diamond. Such heat sink is produced by a simple process including arranging a base material and fins for growing diamond in such a manner that the surface of the base material and the upper ends of the fins are substantially the same height by the use of a suitable supporting member or by working the base material itself and growing diamond thereon by a gaseous phase synthesis method.

16 Claims, 3 Drawing Sheets

FIG. 4
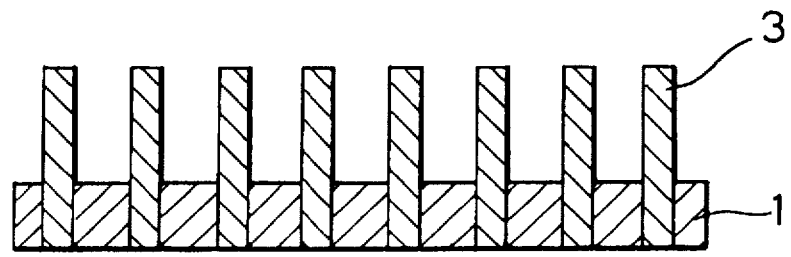
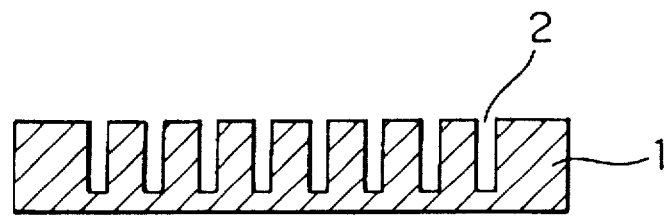
FIG. 5A
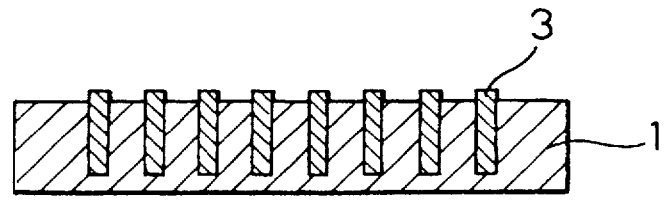
FIG. 5B
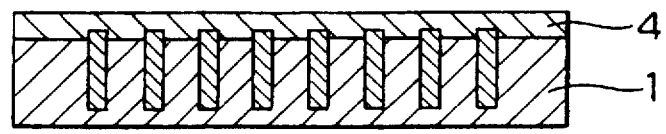
FIG. 5C
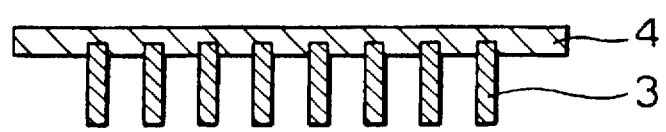
FIG. 5D

5,791,045

PROCESS FOR THE PRODUCTION OF A DIAMOND HEAT SINK

This is a divisional application of Ser. No. 08/257,288, filed Jun. 9, 1994, now U.S. Pat. No. 5,642,779.

BACKGROUND OF THE INVENTION

1. Field of the Invention

This invention relates to a process for forming a heat sink, in particular a diamond heat sink having a very high thermal property, used for radiation of semiconductor devices or compressors.

2. Description of the Prior Art

With the miniaturization and increase of processing speed of information processing systems, the processing capacity per unit area of a semiconductor device in such a system is rapidly increasing. This results in an increase of the heat quantity of heat per unit area generated in the semiconductor device, and the importance of maintaining the thermal property thereof has been observed with keen interest when designing a substrate to be mounted. Up to the present time, a number of combinations of alumina substrates and metallic heat sinks with fins have been used, but because of the low heat conductivity (0.29 W/cm·K) of alumina, a sufficient thermal property cannot be obtained, even in combination with the metallic heat sink.

Requirements for the thermal property of a package to be mounted by semiconductor devices have become more sever because of an increase of the heating value with the high effectiveness of the devices to be mounted. Thus, as a means for lowering the heat resistance of the package, for example, it has hitherto been known to employ a higher heat conductivity material or to improve convection heat conduction by forced air cooling, forced water cooling, etc.

As a heat sink material of a semiconductor device having a higher thermal property, it has been proposed to use diamond, cubic boron nitride (CBN), aluminum nitride, etc. However, these high heat conductivity materials have a problem that, though their heat conductivity is higher than that of alumina, etc., their production cost is higher. In particular, diamond is contemplated as a heat sink for semiconductors, since the gaseous phase synthesis technique has lately been developed and has progressed, and a sheet-shaped heat sink with a large area can be obtained. However diamond is much more expensive than the ordinary materials of the prior art and its high heat conductivity cannot effectively be utilized, since a fin-fitted diamond heat sink cannot be prepared and joint use of a metallic fin-fitted heat sink is required.

Ordinary materials used for the package, for example alumina, will surely meet with a problem regarding the thermal property thereof when a higher performance device is put to practical use in the near future. Namely, in the present package, there will arise a problem that the heat resistance thereof is so large that heat generation of the device itself cannot be radiated sufficiently, thus raising the temperature of the device and the device will fail to function normally. In order to solve this problem, it is effective to use a high heat conductivity material, as described above, and diamond having the highest heat conductivity of prevailing materials has been used as a semiconductor laser diode. At the present time, as a diamond for radiation, there are used natural single crystal diamond or artificial single crystal diamond prepared by a high pressure synthesis method and polycrystal prepared by a gaseous phase synthesis method. However they generally are limited to plate-shaped crystals.

However, the heat transferred by a heat sink should finally be discharged through a fluid such as air or cooling water, and a structure with a large radiation area, such as a fin-fitted heat sink, is preferable for improving the heat exchange function with such a fluid.

SUMMARY OF THE INVENTION

It is an object of the present invention to provide a heat sink of small size, having a very high thermal property, and capable of being used as a heat sink for mounting semiconductor devices.

It is another object of the present invention to provide a diamond heat sink having a very high thermal property and used for radiation of semiconductor devices or compressors.

It is a further object of the present invention to provide a process for the production of a diamond heat sink having a very high thermal property.

These objects are achieved by forming a heat sink comprising a plate-shaped substrate and fins to increase the thermal property, the fins being combined with the substrate and being of a material having a heat conductivity of at least 1 (W/cm·K), preferably at least 5 (W/cm·K).

BRIEF DESCRIPTION OF THE DRAWINGS

The accompanying drawings illustrate the principle and merits of the invention in greater detail.

FIG. 4 is a sectional view of the heat sink of FIG. 1.

FIGS. 5(a)–5(d) are sectional views illustrating another embodiment of a process for the production of a heat sink according to the present invention.

DETAILED DESCRIPTION OF THE INVENTION

Figure 1:
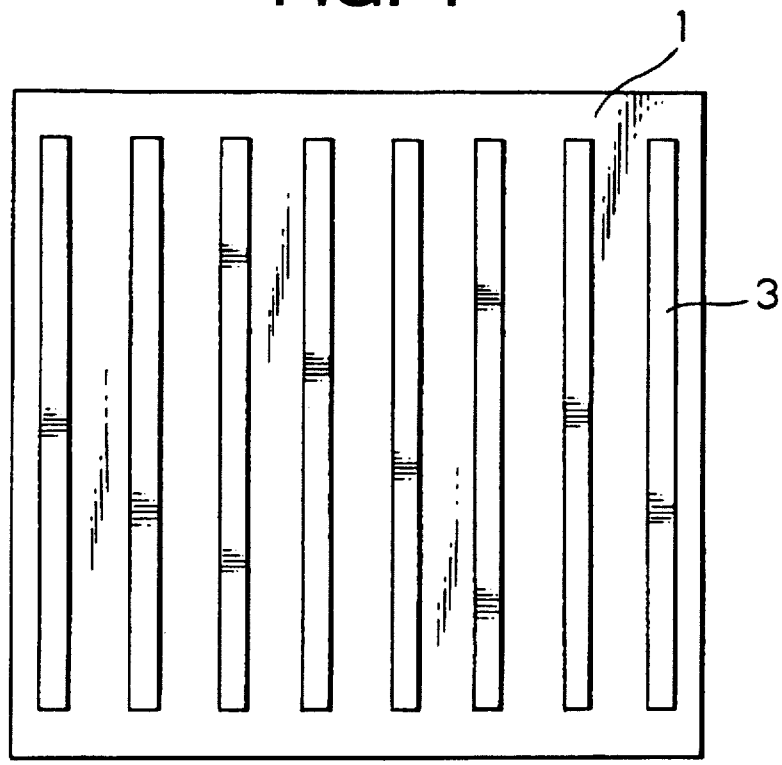
FIG. 1 is a plan view of a heat sink formed according to one embodiment of the present invention.
Figure 2:
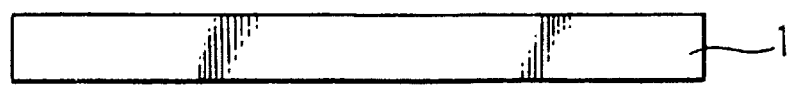
FIG. 2 is an end view of a heat sink part of a ceramic PGA (Pin Grid Array) package employed in the heat sink of FIG. 1.

The inventors have made detailed studies on the structure of a heat sink used for mounting semiconductor devices in order to solve the above described problems, and consequently have found that even when an ordinary material such as alumina is used for a heat sink, the thermal property is sufficiently improved by making only fin parts of the heat sink of a high heat conductivity material such as diamond or cubic boron nitride. Of course, when a substrate or base also is made of a high heat conductivity material such as diamond, a higher effect can be obtained. Furthermore, it has been found that the thermal property is further improved by burying fins formed of a high heat conductivity material in a base material to be near a side thereof where semiconductor devices are mounted on the base material, as opposed to bonding the fins to the surface of the base material.

Thus, heat resistance can be decreased substantially by forming a heat sink having a fin structure of a large heat conductivity material on the radiation surface. Namely, the present invention provides a method of producing a heat sink comprising a plate-shaped substrate and fins for increasing the thermal property, the fins being combined with or joined to the substrate and being of a material having a heat conductivity of at least 1 (W/cm·K), preferably at least 5 (W/cm·K).

According to the present invention, there is provided a method of producing a diamond heat sink comprising at least a plate-shaped diamond substrate and fins provided on the diamond substrate to increase the thermal property, the fins being of a material having a heat conductivity of at least 1 (W/cm·K), and more specifically, there is provided a diamond heat sink comprising at least a plate-shaped diamond substrate and fins provided on the diamond substrate to increase the thermal property and formed of diamond.

The present invention provides a very simple process for the production of a diamond heat sink having a fin structure by a gaseous phase synthesis method. Such process includes arranging a base material and fins for growing diamond in such a manner that a surface of the base material and an upper end of the fin are substantially the same height by the use of a suitable supporting member or by working the base material itself and growing diamond thereon by the gaseous phase synthesis method. The fin material is not required to be free-standing and can be a material having a heat conductivity of at least 1 W/cm·K. A free-standing film is a film having a thickness capable of substantially maintaining a shape as a diamond film even if the base material is removed, and ordinarily having a thickness of about at least 0.1 mm.

For example, there are processes comprising arranging suitable blocks with gaps therebetween for forming fins, inserting diamond free-standing films in the gaps, placing a base material for the growth of diamond on the blocks and growing diamond by gaseous phase thereon, or comprising forming grooves for inserting diamond free-standing film previously prepared in a desired size on a substrate which can readily be worked, inserting the diamond free-standing films in the grooves, then growing diamond thereon and removing the base material.

According to the present invention, one process for the production of a diamond heat sink having fins for increasing the thermal property includes a step of working or arranging at least a base material in such a manner that the base material is provided with gaps for inserting fins and the highest parts of the fins when inserted and the surface of the base material are substantially the same height, a step of inserting the fins in the gaps, a step of growing diamond on the base material and the fins, and a step of removing the base material to obtain a diamond heat sink having the fins.

Another process for the production of a diamond heat sink having fins for increasing the thermal property includes a step of cutting to a suitable shape at least a diamond plate prepared by a gaseous phase synthesis method to obtain divided diamond base materials, a step of placing the diamond base materials on a supporting member in such a manner that there are formed gaps for inserting fins, with the highest part of the fins when inserted and the surface of the divided diamond base materials being substantially the same height, a step of inserting the fins in the gaps, and a step of growing diamond on the diamond divided base materials and fins, thus obtaining a diamond heat sink substrate having the fins without removing the diamond divided base materials.

Another process for the production of a diamond heat sink having fins for increasing the thermal property includes a step of arranging divided base materials on blocks with gaps therebetween for inserting fins, a step of inserting fins in the gaps of the divided base materials in such a manner that the highest parts of the fins and the surface of the divided base materials are substantially the same height, a step of growing diamond on the divided base materials and fins, and a step of removing the divided base material to obtain a diamond heat sink having the fins.

Another process for the production of a diamond heat sink having fins for increasing the thermal property includes a step of cutting a diamond plate prepared by a gaseous phase synthesis method in a suitable shape to obtain divided base materials, a step of arranging the divided diamond base materials on blocks with gaps therebetween for inserting fins, a step of inserting the fins in the gaps of the divided diamond base materials in such a manner that the highest parts of the fins and the surface of the divided base materials are substantially the same height, and a step of growing diamond on the divided diamond base materials and fins, thus obtaining a diamond heat sink having the fins without removing the divided diamond base materials.

Another process for the production of a diamond heat sink having fins for increasing the radiation property includes a step of forming grooves, with a suitable depth for inserting fins, in a base material for growing at least diamond, a step of inserting fins having a height substantially the same as the depth of the grooves in the grooves formed in the base material, a step of growing diamond by a gaseous phase synthesis method on the base material in which the fins have been inserted, and a step of removing the base material to obtain a diamond heat sink having the fins. The thickness of the diamond heat sink should naturally be at least a thickness capable of being free-standing, but if the heat sink is too thick, a long time is taken for the synthesis thereof to be economical, while if the heat sink is too thin, the mechanical strength thereof is lowered. Thus, a thickness of 0.33 mm to 5 mm preferably is used.

One embodiment of the present invention will now be described. That is, polycrystalline diamond synthesized by a gaseous synthesis method is bonded, for example by brazing, to form fins on the surface of a widely applicable substrate formed of a material with a relatively low heat conductivity, such as alumina. According to this structure, some improvement can be found in the thermal property, but it is preferable to work a part of a plate-shaped base material on which a device is to be mounted so that the fins can be embedded or buried to a depth of at least half of the thickness of the base material. More preferably, a penetration hole is made, in which a diamond fin is buried, to provide such a structure that heat generated by the device is released through the diamond having high heat conductivity, thereby increasing the radiation efficiency.

A combination of alumina and diamond, as described above, is not always required, but use of a high heat conductivity material for the fin part is sufficient. It is preferable to use a fin material having a heat conductivity of at least 5 (W/cm·K), and polycrystalline diamond produced by gaseous phase synthesis and having a heat conductivity of 8 to 20 (W/cm·K) is the most preferable in view of the production cost and resultant properties, but high pressure synthesis single crystal diamond (15 to 30 W/cm·K) or high pressure sintered polycrystalline cubic silicon nitride (5 to 8 W/cm·K) also can be used. The material of a base material to be mounted by fins can be chosen from relatively inexpensive and low heat conductivity materials, and alumina which can be provided at a low cost and which can give actual results as a semiconductor substrate preferably is used. When using a material having a heat conductivity of at most 0.05 (W/cm.K), satisfactory results cannot be obtained because a temperature gradient between a fin and a part apart from the fin is increased. The shape of a fin should be such that the thickness is at least 50 µm for the purpose of effectively performing thermal conduction, but a thickness of more than 2 mm is not preferable because of the resultant cost increase. The height of a fin projected from the substrate should preferably be at least 0.5 mm and effective radiation of heat can be achieved at a range of 2 to 15 mm.

As to the shape of a substrate to be provided with fins, penetration working or treatment thereof is not necessarily required, and it is preferable that the fins reach the vicinity of semiconductor devices at least by half of the thickness of the base material. A diamond fin can be obtained by preparing a diamond free-standing film by an ordinary gaseous phase synthesis method and working thereof a desired shape by the use of a laser. Moreover, high pressure synthesis single crystal diamond can be used if it can be worked to a desired size. Any known procedure can be used in the gaseous synthesis of diamond.

Another embodiment of the present invention will now be described. In the case of using diamond as a substrate, the structure of a heat sink preferably is as described below. Preferably, the fins are formed from free-standing films of gaseous phase synthesis diamond, since such films have a high heat conductivity and readily are obtainable with a large area. Any method of synthesis of this film can be used, for example, comprising growing diamond to a thickness of more than what can be obtained as a free-standing film, and then removing a base material by any of known methods (e.g. acid treatment). The free-standing film, which will be a fin part of the heat sink, is subjected to a cutting operation to a size corresponding to the fin, for example by use of a laser.

Since diamond having the highest heat conductivity is used as a main body for transporting heat of the heat sink in the present invention (when using diamond as a substrate), a high radiation effect as a whole can be obtained, even if another material which has not such a high heat conductivity as diamond is used as a fin. The material of the fin of the diamond heat sink can be selected from those having a heat conductivity of at least 1 W/cm·K at near room temperature and resisting a temperature of 700° C. during growth of diamond. Such a material includes diamond, cubic boron nitride, silicon, silicon carbide, aluminum nitride, copper, tungsten, molybdenum, etc. Above all, materials having thermal expansion coefficients similar to diamond preferably are used, selected from diamond, cubic boron nitride, silicon, silicon carbide, aluminum nitride, copper, tungsten, molybdenum, etc. Such materials also can be used as the substrate or base material. In particular, preferably such materials are those that, when diamond is grown on an end of such substrate thereof by gaseous phase synthesis, the bonding property therebetween can be well maintained. Illustrative such materials are high pressure synthesis single crystal diamond or natural single crystal diamond, gaseous phase synthesis diamond described above, cBN sintered bodies, etc.

Considering thermal property and production efficiency, the shape of the fin preferably should be such that the thickness is 50 µm to 2 mm and the height is at least 2 mm. The interval between fins preferably is in the range of about 1 to 5 mm, since if too small the thermal property is remarkably degraded, while if too large the radiation area is not very large. This range depends on conditions of heat generation of devices to be mounted and air cooling of a package.

Production of a diamond heat sink having fins according to the present invention is generally carried out by a method comprising supporting a material to be fins by a certain means, truing up upper ends of the fins and growing diamond thereon by a gaseous phase synthesis method. Two examples of the supporting method are described below in detail.

The first method comprises using blocks spaced at suitable intervals. That is, blocks made of a material stable in an atmosphere for gaseous phase synthesis of diamond are arranged with gaps therebetween into which fin materials are inserted. The size of the gap is suitably determined depending upon the interval between the fins. Base materials capable of growing diamond by gaseous phase synthesis are spread over all the blocks. The base material should satisfy the requirement that diamond can be grown thereon and thereafter the base material readily can be removed. Specifically, polycrystalline silicon can be used. It is preferable to subject the base material to a scratching treatment so as to readily enable diamond growth.

When using diamond as a base material, the subsequent step of removing the base material can be omitted and the base material thus can be effectively utilized. The height of a block on which a base material is to be placed preferably should be so that the surface of the divided base material to be placed thereon is the same as or somewhat lower than the height of a fin. After the base material and fins are arranged in this way, diamond is grown by a gaseous phase synthesis method. The gaseous phase synthesis method of diamond is not particularly limited, but in the case of using a hot filament CVD method, for example, a heat sink with a large area can be obtained in a relatively easy manner. The thickness to be grown can be adjusted to such an extent that a free-standing film can be obtained. After diamond is grown in a desired thickness, the base material can if necessary be removed to obtain a diamond heat sink having fins.

The second method comprises using a base material which can be grooved. That is to say, a material is selected to be capable of satisfying such conditions that diamond can be grown thereon, grooves can be formed therein, and such material only readily can be removed after growth of diamond thereon and insertion therein of a fin material, for example previously prepared diamond free-standing film at predetermined positions. The method of groove formation is not particularly limited and can be performed on any one of base materials which can be worked on the surface thereof with such a precision that the fin material can be inserted. When the fin is inserted, it is preferable that the upper end of the fin is at the same level as or is somewhat projected from the surface of the substrate. It is not preferable that the upper end of the fin be somewhat lower than the surface of the substrate in a manner similar to the method using blocks. The base material used herein may be, for example, polycrystalline silicon.

Furthermore, diamond is spread over a groove-free area of a base material in a manner similar to the method using blocks, and diamond is grown thereon, whereby the step of removing the divided base material can be omitted and the blocks can be reused. In this case, it is also preferable that the relationship between the surface of the spread diamond and the height of the fin is that the fin is somewhat projected from or is at the same level as the surface of the diamond. Thus, diamond is grown on the base material having high heat conductivity fins inserted by a gaseous phase synthesis method. In this method, a scratching treatment of the surface of the base material is also preferably carried out before grooving or before inserting the fins. The diamond grown herein should have such a thickness that a free-standing film can be obtained. After diamond is grown to such an extent that a free-standing film is obtained, the diamond and base material are taken from the blocks and the base material is removed. A radiation substrate having diamond or high heat conductivity fins on the diamond is thus obtained. As a method of removing the base material part, an acid treatment is used.

When using the structure of a heat sink produced according to the present invention, there can be obtained a substrate having a higher thermal property at a relatively lower cost, compared with the prior art substrate structure. Accordingly, high output and high speed devices which cannot be mounted on substrates using alumina can be mounted at a lower cost.

Moreover, when using the structure of a diamond heat sink produced according to the present invention, the thermal property of the prior art package can be improved substantially and there is realized a heat sink on which high speed and high power consumption devices can be mounted. Furthermore, according to the production process of the present invention, a heat sink having fins using diamond, on which high performance devices can be mounted, can be produced in a simple and effective manner.

The following examples are given in order to illustrate the present invention in detail without limiting the same.

EXAMPLE 1

Diamond was synthesized at a thickness of 1 mm on a polycrystalline Si base material (24×24×5 mm) by a hot filament CVD method under synthetic conditions of an atmosphere of methane 2%-$H_2$, a total pressure of 100 Torr and base material temperature of 800° C. After the diamond (heat conductivity: 14 W/cm·K) was synthesized under these conditions, the Si base material was dissolved in a mixed acid to obtain a free-standing diamond film of 50×25×1 mm. The grown surface of this free-standing film was then subjected to polishing and mirror-finishing and cut into eight films of 6×24×1 mm using an excimer laser, after which the entire surfaces were metallized in the order of titanium, platinum and gold.

Figure 3:
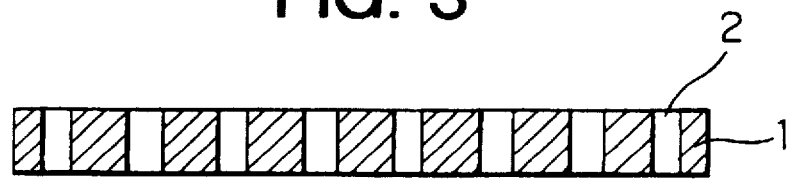
FIG. 3 is a sectional view of the heat sink part shown in FIG. 2, in which hollows or grooves are formed.

On the other hand, as shown in FIG. 1, a heat sink part 1 (thickness: 2 mm) of an ordinary alumina ceramics PGA package was subjected to a laser treatment to form hollows 2 (FIG. 3) each having a length of 24 mm and width of 1 mm and was metallized in the manner similar to that described above. The above described diamond films, as fins 3, were inserted in respective hollows or grooves 2 and bonded therein by gold-tin brazing. Similarly, another package was prepared with fins of high pressure synthesis polycrystalline cubic boron nitride (heat conductivity: 6.5 W/cm·K) inserted therein.

When the heat resistance of the thus obtained packages was measured under a state of natural air cooling, it was 20° C./W in the case of the diamond fins and 26° C./W in the case of the cubic boron nitride fins. It was thus confirmed that the heat resistance was decreased to a greater extent, compared with 35° C./W before fitting of the fins, and the present invention was effective for improving the stability of semiconductor devices.

EXAMPLE 2

As shown in FIG. 5(a), a polycrystalline Si base material 1 (30×30×5 mm) was subjected to scratching by the use of diamond abrasive grains and then eight grooves 2 22 mm in length, 1 mm in width and 4 mm in depth were formed at intervals of 2 mm. cBN sintered bodies 3 (4×24×1 mm. 5 W/cm·K) as fins were inserted into respective of the grooves, during which the height of each fin was controlled by inserting a suitable spacer in the respective groove in such a manner that the upper part of the fin was projected above the base 1 by an amount in the range of 50 to 100 μm (FIG. 5(b)). Polycrystalline diamond 4 was grown to a thickness of 1 mm by a hot filament CVD method on the thus resulting polycrystalline Si base material in which the cBN sintered bodies 3 had been inserted (FIG. 5(c)). The growing conditions were an atmosphere of 2% $CH_4$-$H_2$, total pressure of 100 Torr and base material temperature of 850° C. The base material Si was then removed by treating with a mixed acid to obtain a diamond heat sink having a size of 30×30×1 mm and having eight cBN fins 3 each having a size of 24×4×1 and embedded in substrate 4 (FIG. 5(d)). The thus obtained heat sink had a thermal property of 0.8° C./W, measured under forced cooling at 2 m/sec, which was substantially less than the heat resistance of 3° C./W in the case of a heat sink having no fins.

When using a Cu-W alloy (80% Cu, 20% W, 2 W/cm·K) as the fin material in this example, the heat sink had a thermal property of 1.3° C./W.

EXAMPLE 3

Figure 6A:
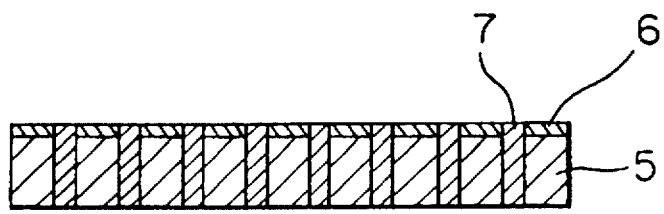
FIGS. 6(a)–6(c) are sectional views illustrating a further embodiment of a process for the production of a heat sink according to the present invention.
Figure 6B:
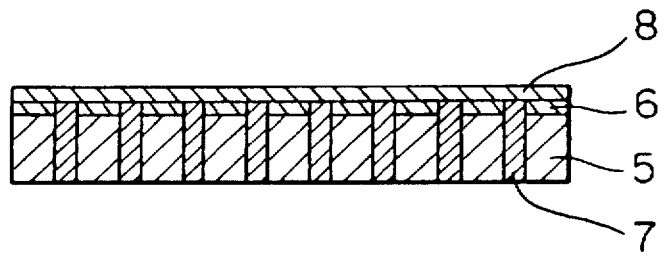
Figure 6C:
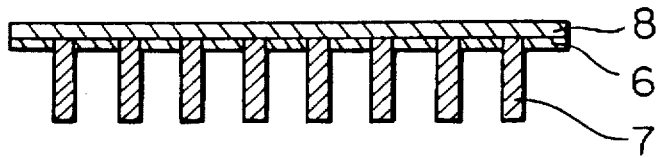

Polycrystalline diamond was grown to a thickness of 600 μm by a hot filament CVD method on a polycrystalline Si base material (25×25×5 mm) under the same conditions as those of Example 2. After dissolving the base material, the product was subjected to processing by an excimer laser treatment to obtain a free-standing diamond film of 2×24×0.6 mm thickness. On the other hand, a free-standing diamond film to be fins (15 W/cm·K) was similarly prepared to a thickness of 1 mm and subjected to a laser treatment to form eight 4×24×1 mm fins 7. Then, nine Mo blocks 5 (2×25×3.5 mm) were prepared and arranged at intervals of 1 mm, between which the previously prepared fins 7 were inserted. The free-standing diamond film of 2×24×0.6 mm thickness was divided into base members 6 that were placed on the blocks as a first layer, as shown in FIG. 6(a), with the height of the upper surfaces of the members 6 lower than that of the fins, but the different was only at most 50 μm. Diamond layer 8 was grown as a second layer to a thickness of 0.4 mm under the same conditions as those of Example 2 on the diamond members 6 arranged on the Mo blocks with diamond fins 7 sandwiched therebetween (FIG. 6(b)). After such growth, blocks 5 were removed and a diamond heat sink having a size of 26×24×1 mm and including eight diamond fins was obtained (FIG. 6(c)), with each fin embedded in 60% of the thickness of the diamond substrate formed by members 6 and layer 8.

What is claimed is:

1. A process for producing a heat sink including fins and having an increased thermal property, said process comprising:

providing a base material with gaps;

inserting fins, formed of diamond or polycrystalline cubic boron nitride and having a heat conductivity of at least 1 (W/c·K), into respective said gaps;

growing diamond on a surface of said base material and on end surfaces of said fins, thereby forming a diamond substrate; and removing said base material, thus forming a heat sink including said substrate having said fins extending therefrom.

2. A process as claimed in claim 1, wherein said providing comprises forming said base material as separate members spaced by said gaps.

3. A process as claimed in claim 1, wherein said providing comprises forming said gaps as recesses or holes in said base material.

4. A process as claimed in claim 1, wherein said inserting comprises positioning inserted first end surfaces of said fins substantially level with a first surface of said base material, such that after removal of said base material said first end surfaces of said fins are substantially level.

5. A process as claimed in claim 4, wherein said inserting further comprises positioning second end surfaces of said fins to extend beyond a second surface of said base material, such that after removal of said base material said second end surfaces of said fins are embedded in said substrate.

6. A process as claimed in claim 1, further comprising forming said fins by a gaseous phase synthesis operation.

7. A process as claimed in claim 1, further comprising forming a diamond or polycrystalline cubic boron nitride film by a gaseous phase synthesis operation, and then separating said film into plural pieces to form said fins.

8. A process for producing a heat sink including fins and having an increased thermal property, said process comprising:

providing a diamond base member with gaps;

inserting fins, formed of diamond or polycrystalline cubic boron nitride and having a heat conductivity of at least 1 (W/c·K), into respective said gaps;

growing diamond on a surface of said base member and on end surfaces of said fins, thus forming a heat sink including a substrate formed by said diamond base member and said diamond grown thereon, with said fins extending from said substrate.

9. A process as claimed in claim 8, wherein said providing comprises forming said diamond base member as a film by a gaseous phase synthesis operation.

10. A process as claimed in claim 9, wherein said providing further comprises separating said film into plural pieces, and spacing said plural pieces to form said gaps.

11. A process as claimed in claim 8, wherein said providing comprises forming said diamond base member as separate members spaced by said gaps.

12. A process as claimed in claim 8, wherein said providing comprises forming said gaps as recesses or holes in said diamond base member.

13. A process as claimed in claim 8, wherein said inserting comprises positioning inserted first end surfaces of said fins substantially level with a first surface of said diamond base member.

14. A process as claimed in claim 8, further comprising forming said fins by a gaseous phase synthesis operation.

15. A process as claimed in claim 8, further comprising forming a diamond or polycrystalline cubic boron nitride film by a gaseous phase synthesis operation, and then separating said film into plural pieces to form said fins.

16. A process as claimed in claim 8, further comprising positioning said diamond base member on blocks spaced at intervals corresponding to said gaps, said inserting comprises locating said fins in respective said intervals, and after said growing removing said blocks.

* * * * *